US007927990B2

(12) United States Patent
Hsia et al.

(10) Patent No.: US 7,927,990 B2
(45) Date of Patent: Apr. 19, 2011

(54) FORMING COMPLIMENTARY METAL FEATURES USING CONFORMAL INSULATOR LAYER

(75) Inventors: Kang-Jay Hsia, Pleasanton, CA (US); Calvin K Li, Fremont, CA (US); Christopher J Petti, Mountain View, CA (US)

(73) Assignee: SanDisk Corporation, Milpitas, CA (US)

( * ) Notice: Subject to any disclaimer, the term of this patent is extended or adjusted under 35 U.S.C. 154(b) by 823 days.

(21) Appl. No.: 11/771,137

(22) Filed: Jun. 29, 2007

(65) Prior Publication Data

US 2009/0004844 A1 Jan. 1, 2009

(51) Int. Cl.
*H01L 21/20* (2006.01)
(52) U.S. Cl. ........ 438/584; 438/381; 438/396; 438/393; 438/253; 438/239; 438/240; 438/626; 257/758; 257/E21.495
(58) Field of Classification Search .................... 438/584
See application file for complete search history.

(56) References Cited

U.S. PATENT DOCUMENTS

| | | | | | |
|---|---|---|---|---|---|
| 5,204,288 | A | * | 4/1993 | Marks et al. .................. | 438/699 |
| 5,534,731 | A | * | 7/1996 | Cheung .......................... | 257/759 |
| 5,679,606 | A | * | 10/1997 | Wang et al. .................... | 438/763 |
| 5,753,564 | A | * | 5/1998 | Fukada .......................... | 438/624 |
| 5,856,707 | A | * | 1/1999 | Sardella ........................ | 257/758 |
| 5,889,328 | A | * | 3/1999 | Joshi et al. .................... | 257/751 |
| 5,913,140 | A | * | 6/1999 | Roche et al. .................. | 438/624 |
| 5,940,702 | A | * | 8/1999 | Sakao ........................... | 438/254 |
| 6,083,821 | A | * | 7/2000 | Reinberg ....................... | 438/619 |
| 6,093,599 | A | * | 7/2000 | Lee et al. ....................... | 438/238 |
| 6,093,634 | A | * | 7/2000 | Chen et al. .................... | 438/622 |
| 6,096,654 | A | * | 8/2000 | Kirchhoff et al. ............. | 438/699 |
| 6,136,685 | A | * | 10/2000 | Narwankar et al. ........... | 438/624 |
| 6,153,512 | A | * | 11/2000 | Chang et al. .................. | 438/624 |
| 6,153,543 | A | * | 11/2000 | Chesire et al. ................ | 438/791 |
| 6,211,040 | B1 | * | 4/2001 | Liu et al. ....................... | 438/424 |
| 6,211,569 | B1 | * | 4/2001 | Lou .............................. | 257/758 |
| 6,218,306 | B1 | * | 4/2001 | Fishkin et al. ................ | 438/692 |

(Continued)

FOREIGN PATENT DOCUMENTS

KR 10-571401 B1 4/2006

(Continued)

OTHER PUBLICATIONS

International Search Report & The Written Opinion of the International Searching Authority, International Application No. PCT/US2008/068499 filed Jun. 27, 2008, Dec. 24, 2008.

*Primary Examiner* — N Drew Richards
*Assistant Examiner* — Ankush k Singal
(74) *Attorney, Agent, or Firm* — Vierra Magen Marcus & DeNiro LLP

(57) ABSTRACT

A method is provided to form densely spaced metal lines. A first set of metal lines is formed by etching a first metal layer. A thin dielectric layer is conformally deposited on the first metal lines. A second metal is deposited on the thin dielectric layer, filling gaps between the first metal lines. The second metal layer is planarized to form second metal lines interposed between the first metal lines, coexposing the thin dielectric layer and the second metal layer at a substantially planar surface. In some embodiments, planarization continues to remove the thin dielectric covering tops of the first metal lines, coexposing the first metal lines and the second metal lines, separated by the thin dielectric layer, at a substantially planar surface.

23 Claims, 10 Drawing Sheets

U.S. PATENT DOCUMENTS

| | | | |
|---|---|---|---|
| 6,239,024 B1* | 5/2001 | Huang et al. ............... 438/634 |
| 6,251,740 B1* | 6/2001 | Johnson et al. ............ 438/381 |
| 6,261,893 B1* | 7/2001 | Chang et al. .............. 438/238 |
| 6,268,274 B1* | 7/2001 | Wang et al. ............... 438/597 |
| 6,274,440 B1* | 8/2001 | Arndt et al. ............... 438/281 |
| 6,291,296 B1* | 9/2001 | Hui et al. .................. 438/257 |
| 6,300,672 B1* | 10/2001 | Lee ........................... 257/641 |
| 6,303,525 B1* | 10/2001 | Annapragada ............. 438/782 |
| 6,362,508 B1* | 3/2002 | Rasovsky et al. .......... 257/369 |
| 6,365,015 B1* | 4/2002 | Shan et al. ................ 204/192.3 |
| 6,376,359 B1* | 4/2002 | Lin et al. ................... 438/622 |
| 6,433,436 B1* | 8/2002 | Feild et al. ................ 257/774 |
| 6,495,877 B1 | 12/2002 | Hsue et al. |
| 6,511,923 B1* | 1/2003 | Wang et al. ............... 438/783 |
| 6,518,120 B2* | 2/2003 | Park .......................... 438/244 |
| 6,559,004 B1* | 5/2003 | Yang et al. ................ 438/253 |
| 6,630,380 B1 | 10/2003 | Cheng et al. |
| 6,734,110 B1* | 5/2004 | Jang et al. ................. 438/706 |
| 6,831,013 B2 | 12/2004 | Tsai et al. |
| 6,841,470 B2* | 1/2005 | Wang et al. ............... 438/633 |
| 6,847,077 B2* | 1/2005 | Thomas et al. ............ 257/301 |
| 6,865,107 B2* | 3/2005 | Anthony et al. ........... 365/171 |
| 6,903,022 B2* | 6/2005 | Peng et al. ................. 438/697 |
| 6,952,030 B2 | 10/2005 | Herner et al. |
| 6,956,278 B2 | 10/2005 | Herner |
| 7,005,375 B2* | 2/2006 | Karthikeyan et al. ...... 438/638 |
| 7,012,336 B2* | 3/2006 | Okura et al. ............... 257/758 |
| 7,018,878 B2 | 3/2006 | Vyvoda et al. |
| 7,018,930 B2* | 3/2006 | Lee et al. ................... 438/706 |
| 7,046,545 B2* | 5/2006 | Hosotani ................... 365/158 |
| 7,148,139 B2* | 12/2006 | Jung .......................... 438/644 |
| 7,186,625 B2* | 3/2007 | Chudzik et al. ............ 438/387 |
| 7,208,095 B2* | 4/2007 | Kundalgurki .............. 216/13 |
| 7,250,370 B2* | 7/2007 | Chang et al. .............. 438/694 |
| 7,300,866 B2* | 11/2007 | Hong ......................... 438/637 |
| 7,429,535 B2* | 9/2008 | Figura et al. .............. 438/720 |
| 7,439,130 B2* | 10/2008 | Park .......................... 438/253 |
| 7,456,072 B2* | 11/2008 | Olewine et al. ............ 438/381 |
| 7,485,574 B2* | 2/2009 | Koh .......................... 438/638 |
| 7,504,334 B2* | 3/2009 | Park .......................... 438/629 |
| 7,557,026 B2* | 7/2009 | Kim et al. .................. 438/597 |
| 7,723,204 B2* | 5/2010 | Khemka et al. ............ 438/430 |
| 2001/0051423 A1* | 12/2001 | Kim et al. .................. 438/624 |
| 2002/0149085 A1* | 10/2002 | Lin et al. ................... 257/522 |
| 2002/0149111 A1 | 10/2002 | Hopper |
| 2002/0173144 A1* | 11/2002 | Yamamoto ................ 438/637 |
| 2002/0177297 A1* | 11/2002 | Cho .......................... 438/629 |
| 2003/0124854 A1* | 7/2003 | Parker et al. .............. 438/692 |
| 2003/0134510 A1* | 7/2003 | Lee et al. ................... 438/674 |
| 2003/0176055 A1* | 9/2003 | Wu ........................... 438/618 |
| 2003/0178666 A1* | 9/2003 | Lee et al. ................... 257/306 |
| 2003/0219979 A1* | 11/2003 | Choi et al. ................. 438/685 |
| 2004/0046230 A1* | 3/2004 | Bernstein et al. .......... 257/528 |
| 2004/0095813 A1* | 5/2004 | Hosotani ................... 365/200 |
| 2004/0132284 A1* | 7/2004 | Ko ............................ 438/653 |
| 2004/0152277 A1* | 8/2004 | Seo ........................... 438/381 |
| 2004/0178172 A1* | 9/2004 | Huang et al. .............. 216/20 |
| 2005/0009333 A1* | 1/2005 | Lee et al. ................... 438/672 |
| 2005/0130401 A1* | 6/2005 | Kim .......................... 438/618 |
| 2006/0038293 A1* | 2/2006 | Rueger et al. .............. 257/751 |
| 2006/0068592 A1* | 3/2006 | Dostalik .................... 438/706 |
| 2006/0110877 A1* | 5/2006 | Park et al. .................. 438/238 |
| 2006/0118907 A1* | 6/2006 | Park .......................... 257/528 |
| 2006/0134930 A1* | 6/2006 | Jeon ........................... 438/798 |
| 2006/0141778 A1* | 6/2006 | Tonegawa et al. ......... 438/638 |
| 2006/0154417 A1* | 7/2006 | Shinmura et al. .......... 438/240 |
| 2006/0154491 A1* | 7/2006 | Xie et al. ................... 438/760 |
| 2006/0292774 A1* | 12/2006 | Chen et al. ................. 438/197 |
| 2007/0020878 A1* | 1/2007 | Nam .......................... 438/424 |
| 2007/0023912 A1* | 2/2007 | Wang ........................ 257/750 |
| 2007/0032035 A1* | 2/2007 | Durcan et al. ............. 438/396 |
| 2007/0059925 A1* | 3/2007 | Choi et al. ................. 438/640 |
| 2007/0148960 A1* | 6/2007 | Park .......................... 438/622 |
| 2007/0236981 A1 | 10/2007 | Herner |
| 2007/0281471 A1* | 12/2007 | Hurwitz et al. ............ 438/638 |
| 2008/0096389 A1* | 4/2008 | Feng et al. ................. 438/692 |
| 2008/0283960 A1* | 11/2008 | Lerner ....................... 257/508 |
| 2009/0041076 A1* | 2/2009 | Inoue et al. ................ 372/46.01 |
| 2010/0124817 A1* | 5/2010 | Kim et al. .................. 438/586 |

FOREIGN PATENT DOCUMENTS

| | | |
|---|---|---|
| KR | 10-2006-006233 A | 6/2006 |
| KR | 10-2006-008350 A | 7/2006 |

* cited by examiner

FORMING COMPLIMENTARY METAL FEATURES USING CONFORMAL INSULATOR LAYER

FIELD OF INVENTION

The present invention relates to methods for forming metal features at a tight pitch using both subtractive and damascene methods. Complementary metal patterns may be formed by etching a metal layer, forming a conformal dielectric layer over the etched surface, and then depositing another metal layer.

BACKGROUND OF THE INVENTION

Methods that increase feature density on semiconductor devices within a shrinking footprint are constantly evolving to meet demands for smaller, more powerful electronic devices. However, in some examples, practical considerations may limit how far those methods may evolve. For example, FIG. 1 is an illustrative cross-section of a prior art example of a metal pattern formed on an underlying layer in 45 nm processes. As illustrated, in FIG. 1, metal 102 may be formed by well-known method into a pattern on an underlying layer 106. For example, metal 102 can be deposited and etched using standard photolithographic techniques. For clarity, only a portion of an example of the fine metal pattern is illustrated in cross-section. Metal patterns may form any number of features or connective lines. Insulator 104 may be provided to form a barrier between metal lines 108 and 110. Metal lines 108 and 110 may have a width 112 of approximately 45 nm and insulator 104 may have a width 114 of approximately 45 nm. As such, pitch 116 of the feature is approximately 90 nm.

In some conventional examples, in order to accommodate more densely arranged features, a decrease in pitch is generally required. With conventional methods of fabrication as described above, this would require moving to a more expensive means of fabrication. For example, a more expensive photolithography tool may be required. Thus, it would be desirable to develop methods that increase feature density without increasing the fabrication expense.

Furthermore, as the line width decreases, metal volume of conducting lines also decreases, thus resulting in an increase in resistance of conductive lines. Thus, it may be desirable to develop methods which provide for increased feature density without a commensurate decrease in conductor linewidth. For example, to fit wider conductor lines in the same area, it would be desirable to minimize the width of gaps between them.

SUMMARY OF THE PREFERRED EMBODIMENTS

The present invention is defined by the following claims, and nothing in this section should be taken as a limitation on those claims. In general, the invention is directed to a method to form very dense metal lines.

A first aspect of the invention provides for a method for depositing at least two metal layers on a underlying layer comprising: depositing a first metal layer on the underlying layer; masking the first metal layer such that the first metal layer includes a first masked portion and a first unmasked portion; and etching the first metal layer such that the first unmasked portion is removed to the underlying layer; depositing a first intermediate layer on the first metal layer and on the underlying layer; depositing a second metal layer on the first intermediate layer; and planarizing the second metal layer to coexpose the first intermediate layer and the second metal layer at a first substantially planar surface.

Another aspect of the invention provides for a method for forming first metal features and second metal features on an underlying layer for use with a semiconductor device, the method comprising: depositing a first metal layer on the underlying layer; masking the first metal layer such that the first metal layer includes a first masked portion and a first unmasked portion wherein the first masked portion and the first unmasked portion correspond to a complementary pattern; etching the first metal layer such that the first unmasked portion is removed to the underlying layer, leaving the first metal features; depositing a first conformal dielectric layer on the first metal layer and on the underlying layer, depositing a second metal layer on the first conformal dielectric layer; and planarizing the second metal layer form the second metal features and to coexpose the second metal features and the first conformal dielectric at a substantially planar surface.

Each of the aspects and embodiments of the invention described herein can be used alone or in combination with one another.

The preferred aspects and embodiments will now be described with reference to the attached drawings.

DETAILED DESCRIPTION OF THE PREFERRED EMBODIMENTS

The present invention will now be described in detail with reference to a few embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Figure 2:
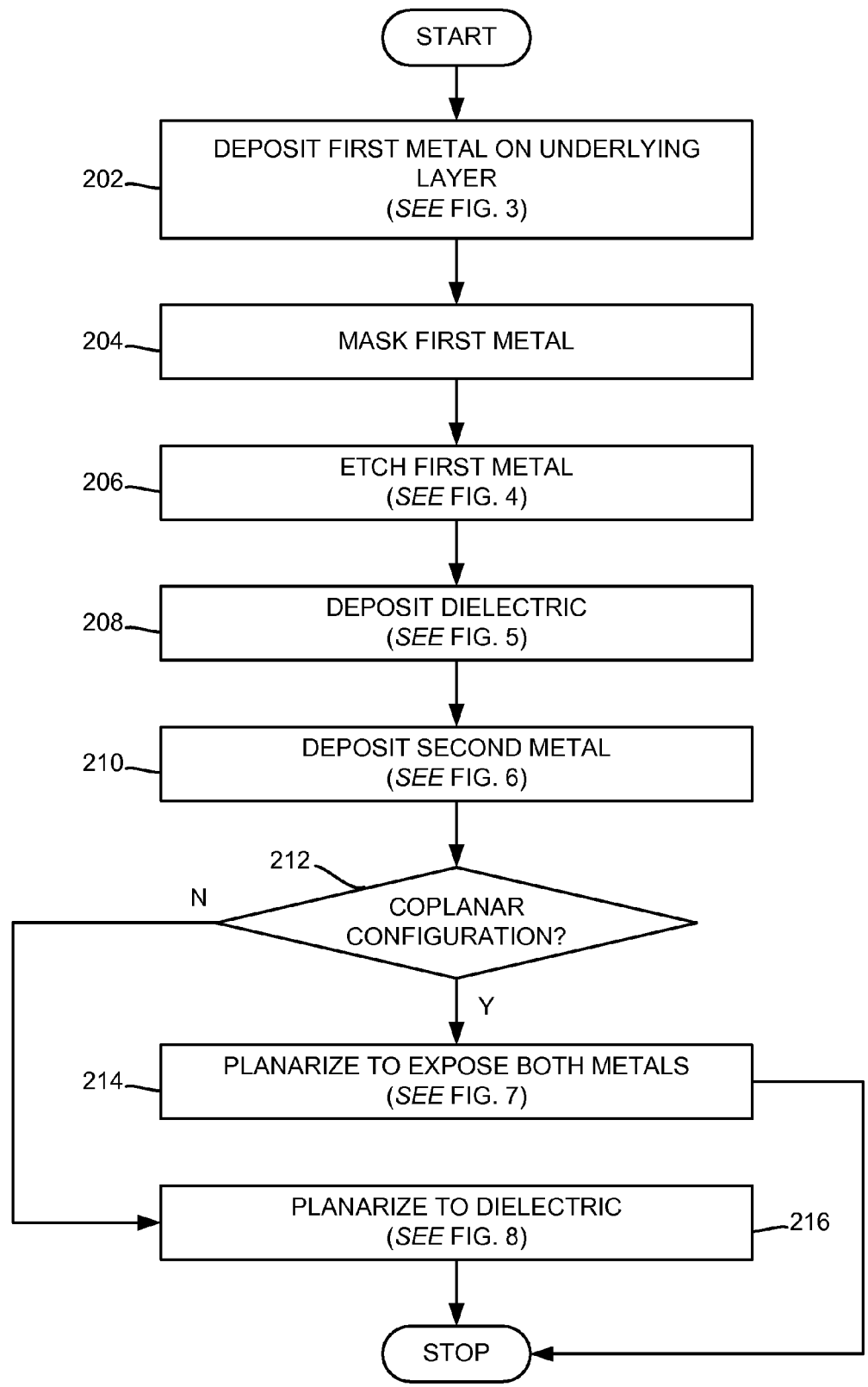
FIG. 2 is an illustrative flowchart of a method for forming metal lines on an underlying layer in accordance with embodiments of the present invention.
Figure 3:
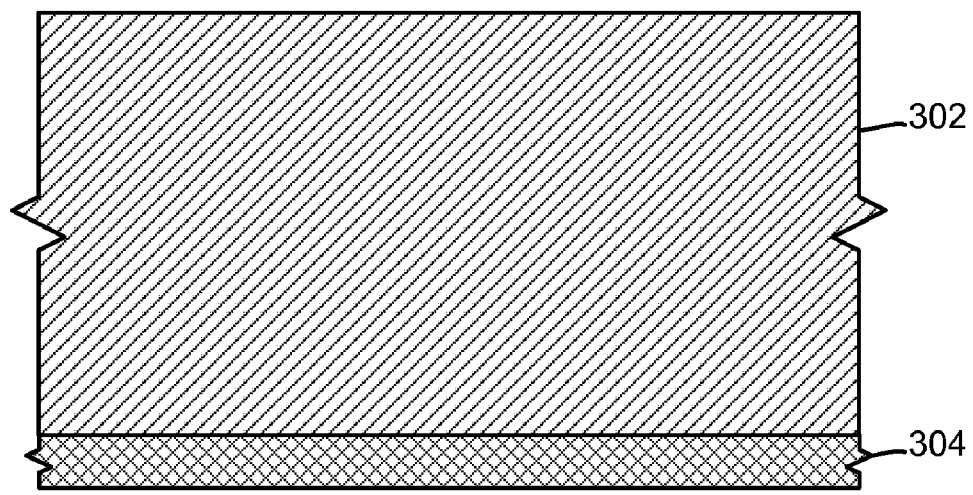
FIGS. 3-6 are cross-sectional views showing stages in formation of metal lines on underlying layers using methods in accordance with embodiments of the present invention.

FIG. 2 is an illustrative flowchart of a method for forming metal lines on an underlying layer in accordance with embodiments of the present invention. FIG. 2 will be discussed in connection with FIGS. 3-8, which are illustrative representations of stages of forming metal lines on underlying layers utilizing methods in accordance with embodiments of the present invention. At a first step 202, a first metal is deposited on an underlying layer. Referring to FIG. 3, in one embodiment first metal layer 302 is deposited on underlying layer 304. As may be appreciated, any number of suitable metal compositions may be deposited on any number of underlying layer compositions using any number of well-known methods without departing from the present invention. Underlying layer 304 is typically a dielectric material such as silicon dioxide. Metal 304 may be tungsten, aluminum, or some other appropriate conductive material. In some embodiments, the thickness of first metal layer 302 is no less than approximately 30 nm. In other embodiments, the thickness of first metal layer 302 is no more than approximately 1000 nm.

Figure 4:
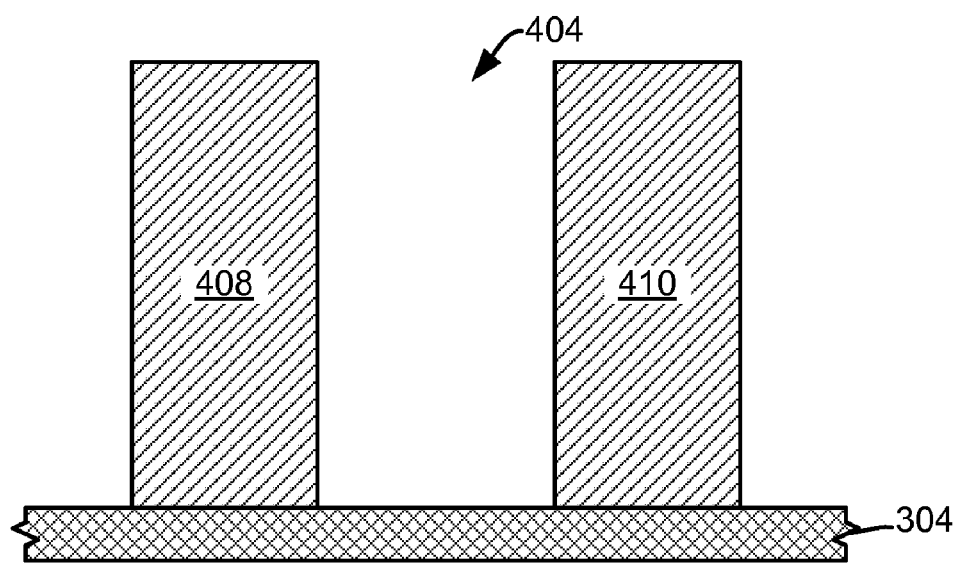

At a next step 204, the first metal layer is masked using any number of well-known methods. Masking typically provides a fine pattern, for example in a light-sensitive material such as photoresist, on a layer so that subsequent etching will remove the unmasked portion of the masked layer. At a next step 206, first metal layer 302 is etched. As seen in FIG. 4, a resulting pattern after etching may consist of a series of metal features; for example the pattern may include trenches such as trench 404 and lines such as line 408 and line 410. In some embodiments, etching may proceed to underlying layer 304. It may be appreciated that in other embodiments, etching may proceed past an underlying layer. Etching may be accomplished in any manner well-known in the art without departing from the present invention.

Figure 5:
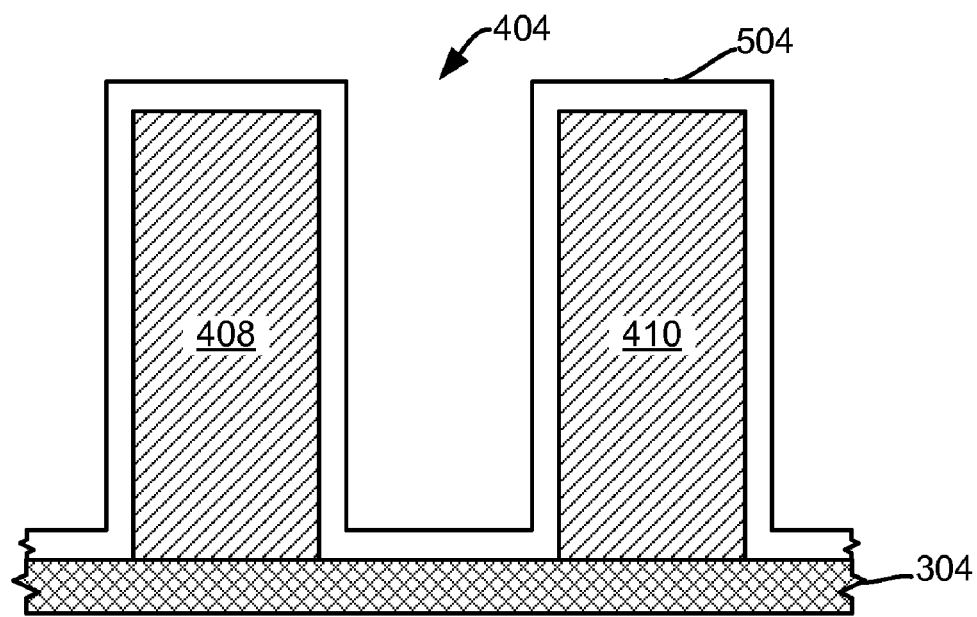

At a next step 208, dielectric may be conformally deposited onto the tops and sidewalls of the remaining metal layer and the exposed underlying layer. Thus, as shown in FIG. 5, dielectric layer 504 may be conformally deposited on and in contact with the tops and sidewalls of lines 408 and 410 and on exposed sections of underlying layer 304 in accordance with an embodiment of the present invention. Dielectric layer 504 may be deposited in any manner well-known in the art. The thickness of dielectric layer 504 is selected so that trench 404 between metal lines 408 and 410 still has sufficient width, after dielectric layer 504 has been deposited, to allow formation of the next metal lines. In some embodiments, the width of trenches 404 after deposition of dielectric layer 504 may be the same, or nearly the same, as the width of first metal lines 408 and 410. Clearly, this requires that the width of trenches 404 before deposition of dielectric layer 504 must be wider than the width of metal lines 408 and 410. In some embodiments, dielectric may be selected to provide a diffusion barrier and an adhesion layer. In some embodiments, $Si_3N_4$ or $SiO_2$ may be utilized for a dielectric layer.

Figure 6:
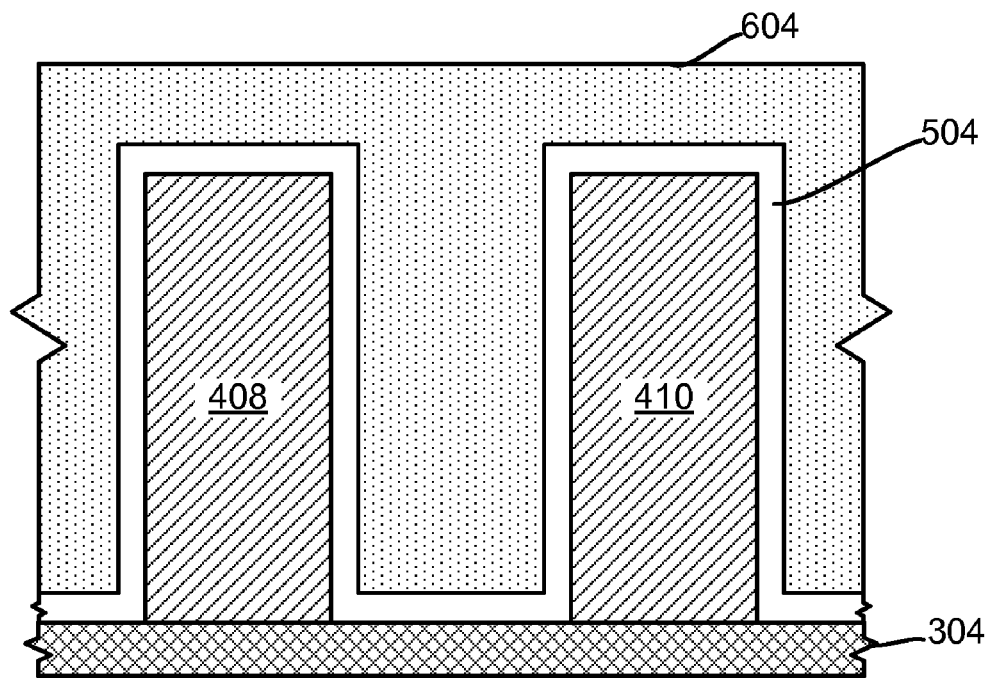

At a next step 210, a second metal is deposited on the dielectric layer. As illustrated in FIG. 6, a second metal layer 604 is deposited on and in contact with dielectric layer 504. In some embodiments, the second metal layer is a composition substantially similar to the first metal layer. In other embodiments, the second metal layer is different from the first metal layer. Further, as illustrated in FIG. 6, second metal layer 604 now forms a complementary pattern to the originally masked first metal layer in accordance with an embodiment of the present invention. That is, the second metal layer fills the etched portion of the first metal layer, which corresponds to the originally unmasked portion of the first metal layer. It may be appreciated that metal compositions selected for deposition may, in some examples, require additional steps or recipes to accommodate chemical and physical properties. In some embodiments, copper or aluminum may be utilized for a second metal layer solely or in combination without departing from present invention. In other embodiments, tungsten may be utilized for a second metal layer. It may be appreciated that use of tungsten for second metal layer deposition may require a conformal adhesion layer before deposition on a dielectric layer. Thus, in some embodiments, a thin adhesion layer such as Ti, TiW, or TiN (solely or in combination) may be conformally deposited on dielectric layer 504 before second metal layer 604 is deposited without departing from the present invention.

Further, it may be appreciated that although the illustrated metal lines are substantially equal in width, lines may be varied in width to compensate for volumetric differences between first metal layers and second metal layers without departing from the present invention. For example, as noted above, where tungsten is utilized as a second metal layer 604 over dielectric layer 504, an adhesion layer may be required. However, use of a TiN adhesion layer may result in a volumetric change of a second metal layer of tungsten with respect to a first metal layer of tungsten. Thus, in order for metal lines to have similar electrical characteristics, the width of metal lines (i.e. second metal layer) may be adjusted to properly compensate for volumetric differences without departing from the present invention.

Further, it may be appreciated that selection of a metal for a first or second metal layer in accordance with embodiments described herein may be optimized for a particular feature or device connected with the metal layer. For example, some metal-semiconductor connections may create an unintended Schottky device. Thus, where only a single metal is available for conductive lines, some device configurations may not be possible. However, because present methods provide for selection of a first metal that differs from a second metal in forming conductive lines, device combinations not otherwise possible may be achieved. Thus in some embodiments the first metal layer and the second metal layer are substantially similar while in other embodiments, the first metal layer and the second metal layer are not substantially similar.

Figure 7:
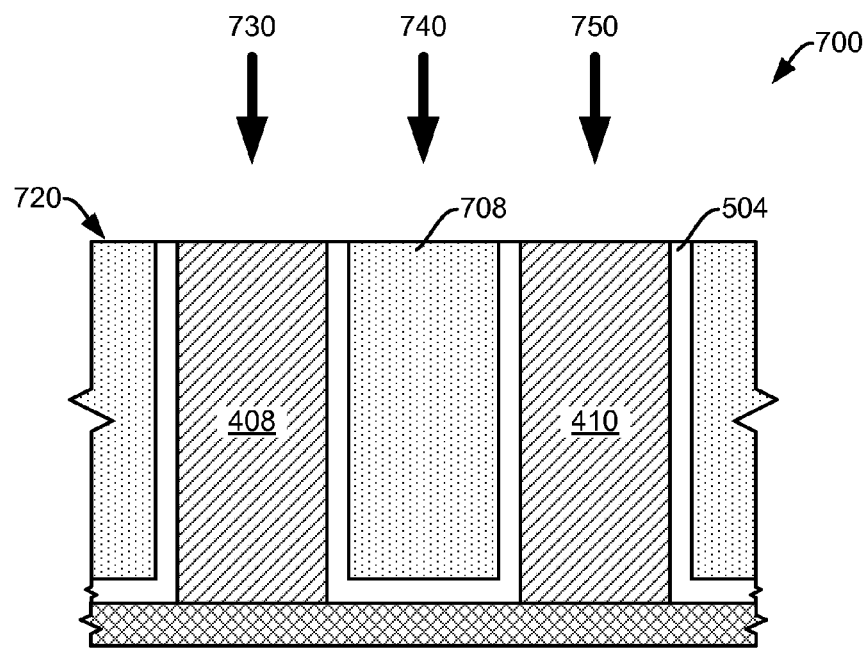
FIG. 7 is a cross-sectional view of metal lines on an underlying layer in accordance with embodiments of the present invention.

At a next step 212, the method determines whether a coplanar configuration is desired. A coplanar configuration is one in which both metal layers may be contacted from the same side; from above, for example. Alternatively, a non-coplanar configuration is one in which either metal layer may be independently contacted from above and from below. Thus, if the method determines, at a step 212, that a coplanar configuration is required, the method continues to a step 214 to planarize the surface of the structure to coexpose both metals at a substantially planar surface. Planarization may be accomplished in any manner known in the art without departing from the present invention such as: chemical mechanical polishing (CMP) and blanket etchback utilizing wet or dry etch methods. As illustrated in FIG. 7, device 700 includes a surface 720 that has been planarized to expose metal lines 408, 708, and 410 in accordance with an embodiment of the present invention. Further, as illustrated, the portions of dielectric layer 504 that are not removed during planarization are also coexposed at the substantially planar surface and serve to insulate these metal lines from one another. Electrical contact may be made to metal lines 408, 708, and 410 at positions 730, 740, and 750 on the same side of structure 700. In some embodiments, the thickness of the second metal layer is no less than approximately 30 nm after planarization. In other embodiments, the thickness of the second metal layer is no more than approximately 1000 nm after planarization.

Figure 8:
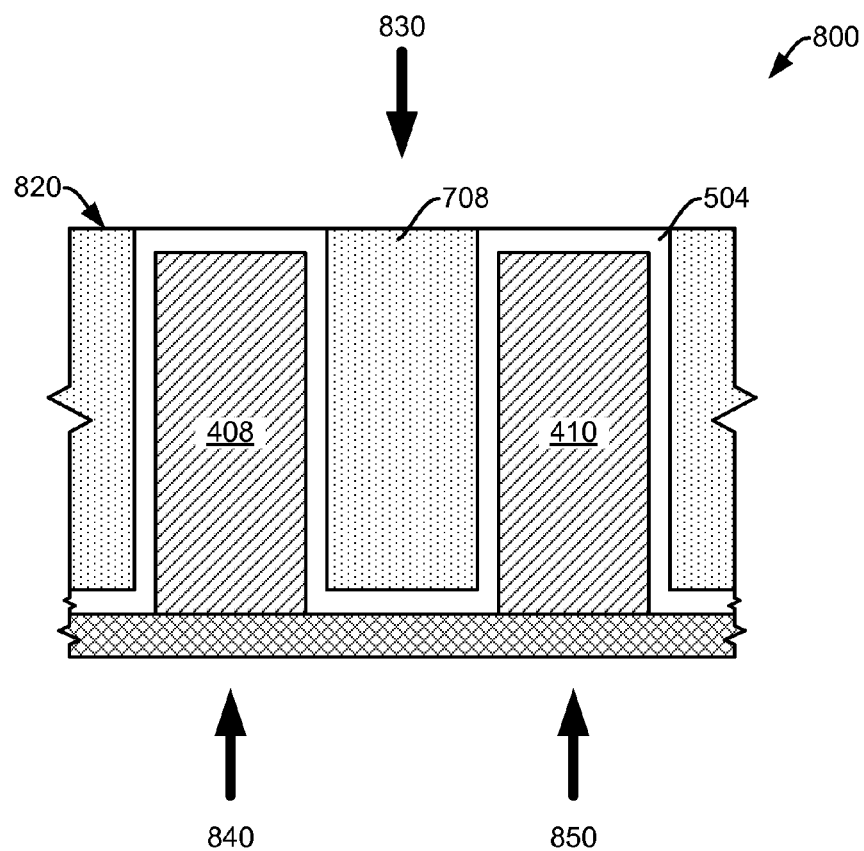
FIG. 8 is a cross-sectional view of metal lines on an underlying layer in accordance with embodiments of the present invention.

If the method determines, at a step 212, that a coplanar configuration is not required, the method continues to a step 216 to planarize the surface of the device, the planarization step stopping on the dielectric 504 and not removing it to expose first metal lines 410 and 408. Planarization may be accomplished in any manner known in the art without departing from the present invention such as CMP and blanket etchback utilizing wet or dry etch methods. As illustrated in FIG. 8, device 800 includes a surface 820 that has been planarized to coexpose dielectric 504 and line 708 at a substantially planar surface in accordance with an embodiment of the present invention. In some embodiments, the thickness of the second metal layer is no less than approximately 30 nm after planarization. In other embodiments, the thickness of the second metal layer is no more than approximately 1000 nm after planarization. Further, as illustrated, first metal lines 408 and 410 remain shielded by dielectric 504 in this embodiment. Electrical contact may be made to metal line 708 at position 830 above structure 800, while electrical contact can be made to metal lines 408 and 410 at positions 840 and 850 below structure 800.

Figure 9:
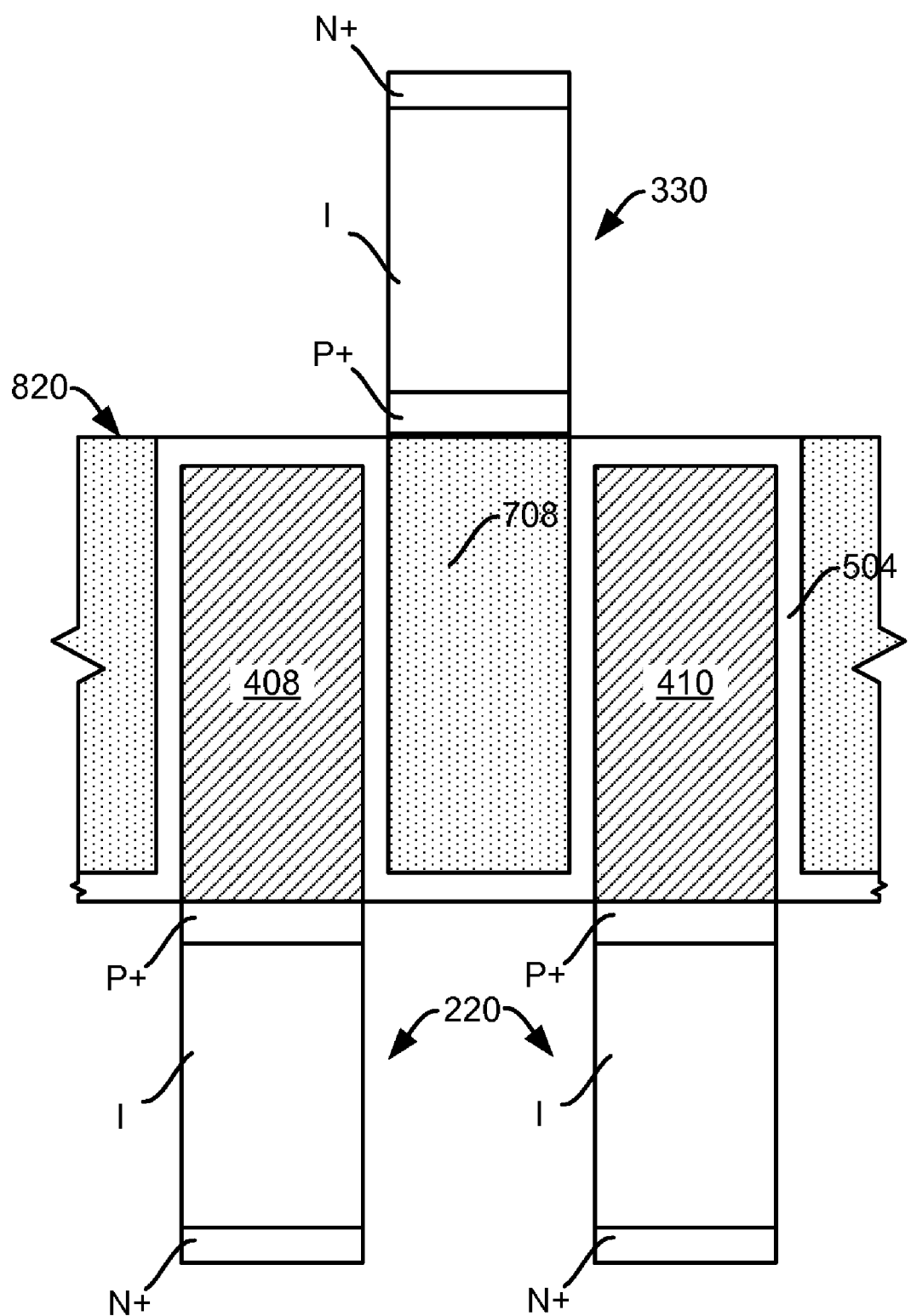
FIG. 9 is a cross-sectional view of metal lines formed according to an embodiment of the present invention used in a monolithic three dimensional memory array.

Herner et al., U.S. Pat. No. 6,952,030, "High-density three-dimensional memory cell," hereby incorporated by reference, describes a monolithic three dimensional memory array including multiple memory levels monolithically formed stacked above a substrate. Each memory level includes a vertically oriented diode disposed between conductors. The diode is preferably a p-i-n diode, having a heavily doped p-type region at one end, a heavily doped n-type region at the other, and an intrinsic region in the middle. Conductors formed according to aspects of the present invention which are contactable from above and below, as in FIG. 8, could be employed in such an array. Turning to FIG. 9, for example, vertically oriented diodes 220 in a first memory level could make electrical contact to first metal lines 408 and 410 from below, while diodes 330 in a second memory level could make electrical contact to second metal lines, such as metal line 708, from above.

In the embodiments of either FIG. 7 or FIG. 8, after the planarization step, a first plurality of substantially parallel metal lines, formed of the first metal, is interspersed with a second plurality of substantially parallel metal lines, formed of the second metal.

Figure 1:
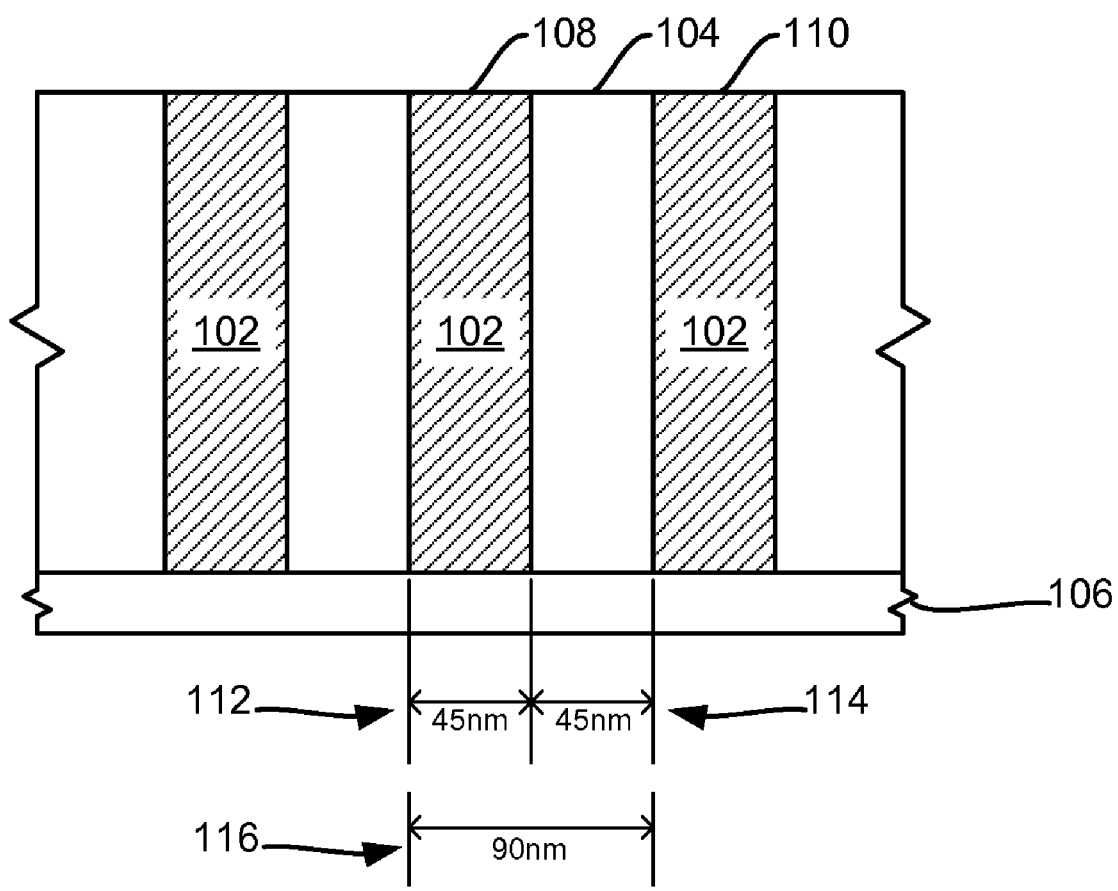
FIG. 1 is a cross-sectional view of a prior art example of an underlying layer having a metal pattern formed in 45 nm processes.

As noted above, in conventional metal line patters formed subtractively, in order to accommodate more densely arranged features, a decrease in pitch is generally required. As pitch decreases, metal volume of conducting lines also decreases, thus resulting in an increase in resistance of conductive lines. In generally the gap between adjacent lines cannot be too narrow, as very narrow lines are difficult to etch cleanly. Referring to the prior art example of FIG. 1, the width of dielectric 104 may be the same as the width of metal lines 108 and 110, and pitch may be double the width of lines 108 and 110.

Referring to FIGS. 7 and 8, the width of dielectric layer 504 between adjacent metal lines 408 and 708 is substantially less than the width of metal lines 408 and 708, and pitch is thus substantially less than double the width of lines 408 and 708, allowing for increased density. Therefore, in one embodiment, for a pitch of approximately 250 nm, the width of metal lines is in the range of approximately 170-230 nm and the width of dielectric is in the range of approximately 20-80 nm. In another embodiment, for a pitch of approximately 180 nm, the width of metal lines is in the range of approximately 140-166 nm and the width of dielectric is in the range of approximately 14-40 nm. In another embodiment, for a pitch of approximately 90 nm, the width of metal lines is in the range of approximately 70-83 nm and the width of dielectric is in the range of approximately 7-20 nm. In another embodiment, for a pitch of approximately 72 nm, the width of metal lines is in the range of approximately 56-67 nm and the width of dielectric is in the range of approximately 5-16 nm. In another embodiment, for a pitch of approximately 58 nm, the width of metal lines is in the range of approximately 45-54 nm and the width of dielectric is in the range of approximately 4-13 nm. In another embodiment, for a pitch of approximately 48 nm, the width of metal lines is in the range of approximately 38-44.5 nm and the width of dielectric is in the range of approximately 3.5-10 nm.

Figure 10A:
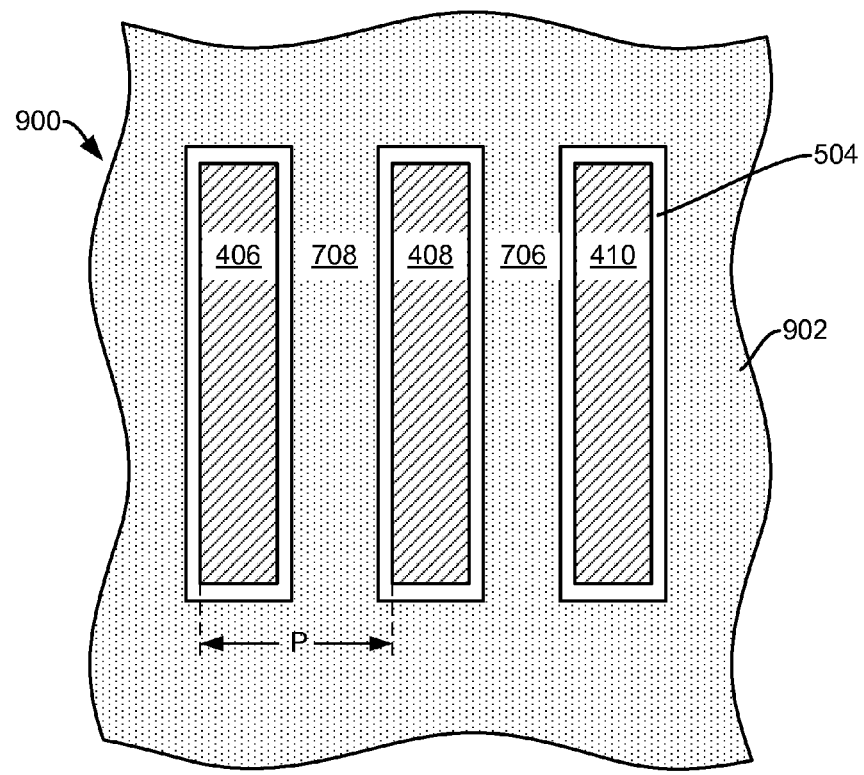
FIGS. 10A-C are plan views of metal lines on an underlying layer in accordance with embodiments of the present invention.
Figure 10B:
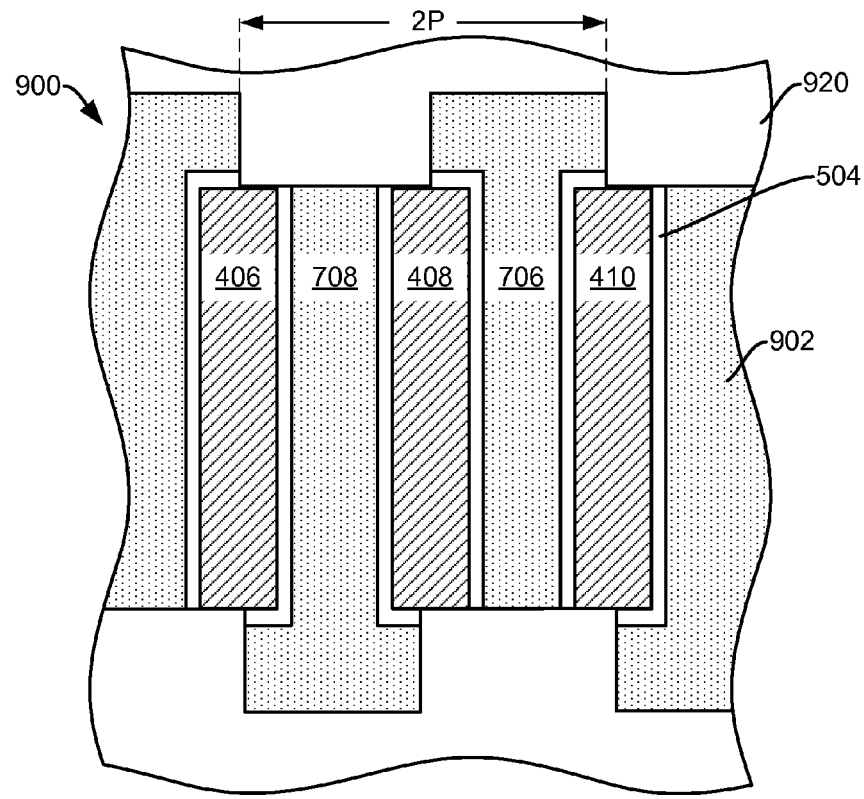
Figure 10C:
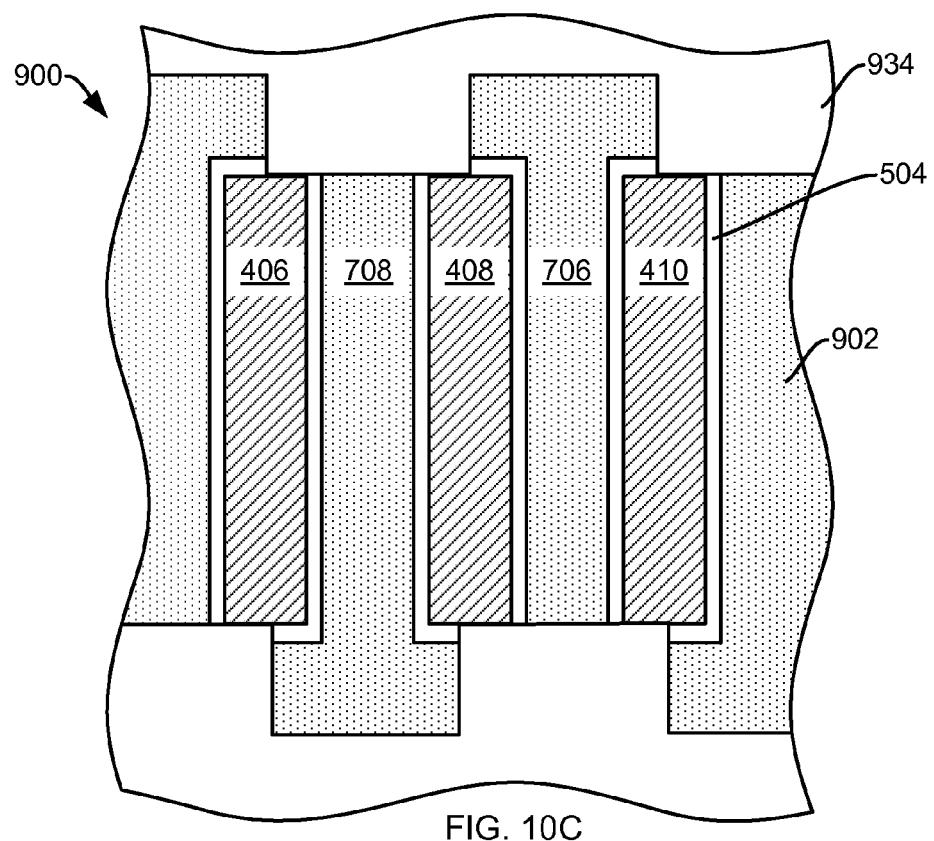

FIGS. 10A-C are illustrative representations of metal lines on an underlying layer in accordance with embodiments of the present invention. FIG. A is a top view of a portion of a semiconductor device 900 fabricated in accordance with embodiments of the present invention. Further, FIG. 10A corresponds to a top view of FIG. 7 as described above. As illustrated, a number of first metal lines 406, 408, and 410 are insulated from surrounding metal 902 by dielectric 504. As may be appreciated, in this configuration, second metal lines 708 and 706 are shorted together, and must be isolated from each other. Referring to FIG. 10B, etch mask 920 may be applied to device 900 to isolate lines 708 and 706 of second metal 902. In this etching step, the second metal only may be masked and etched, or the first metal and the second metal may both be masked and etched. Etching continues to at least the underlying layer whereupon a conformal dielectric layer may be deposited on all exposed surfaces. Any suitable dielectric layer known in the art may be utilized without departing from the present invention. In some embodiments, $Si_3N_4$ or $SiO_2$ may be utilized as a dielectric layer. The device may then be planarized to coexpose the metal lines at a substantially planar surface as illustrated in FIG. 10C. As illustrated, the first set of metal lines such as lines 406, 408, and 410 and second set of metal lines such as line 708 and 706 are surrounded by dielectric 934.

FIGS. 10A-C also illustrate how the current invention can reduce process cost. Conductors 406, 408, and 410 are patterned at a pitch P. The density of these conductors is therefore 1/P lines per unit width. The result in FIG. 10B has a density of conductor lines of 2/P lines per unit width. In a conventional patterning process, this density would require patterning at pitch of P/2, which would require processing tools that are twice as capable as those required when using methods of the present invention. An additional mask 920 is required in the example shown, but the pitch of the shapes in mask 920 on FIG. 10B is 2P. Thus, a conductor density P/2 that would normally call for one patterning step with a pitch capability of P/2 is fabricated by two patterning steps, one with a capability of P, and one with a capability of 2P. The cost of the patterning tools is a strong function of their pitch capability. Thus the process of the current invention can be expected to be less expensive than a conventional process.

Figure 11:
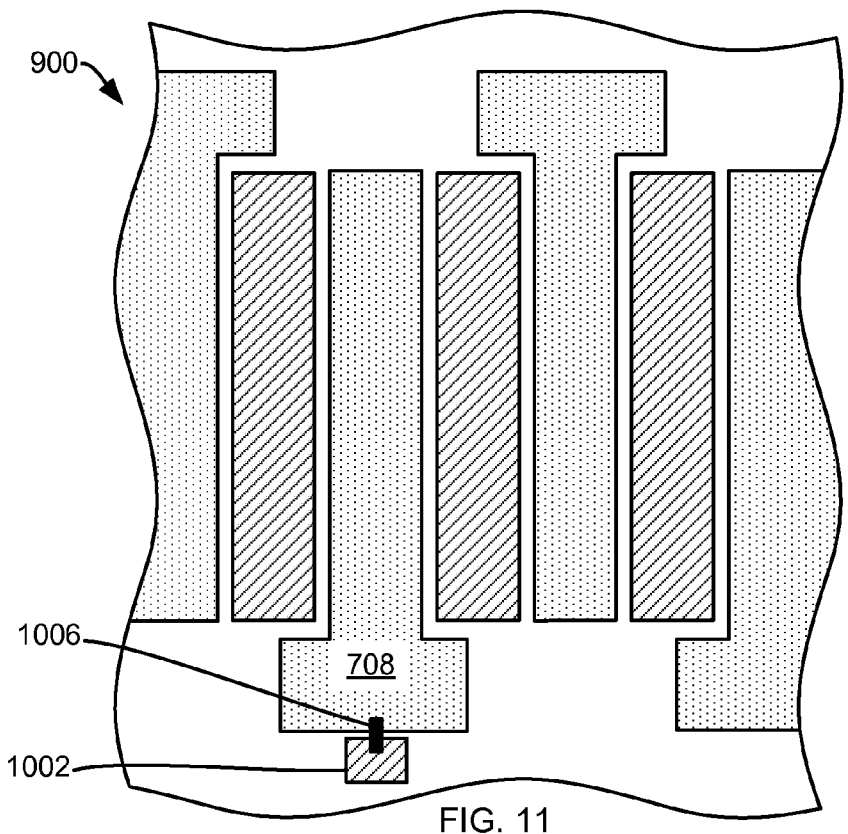
FIG. 11 is a plan view of a connection between a first metal line and a second metal line in accordance with an embodiment of the present invention.

FIG. 11 is an illustrative example of a connection 1006 between a first metal line 1002 and a second metal line 708 in accordance with an embodiment of the present invention. As described above, a first set of metal lines may be defined from a first metal layer and a second set of metal lines may be defined from a second metal layer. As may be appreciated, in some embodiments, it may be desirable to connect some portion of the first set of metal lines with some portion of the second set of metal lines. Thus, in some embodiments, a via 1006 may be formed to connect first metal line 1002 with second metal line 708. As may be appreciated, vias may be formed in any manner well-known in the art without departing from the present invention.

Figure 12:
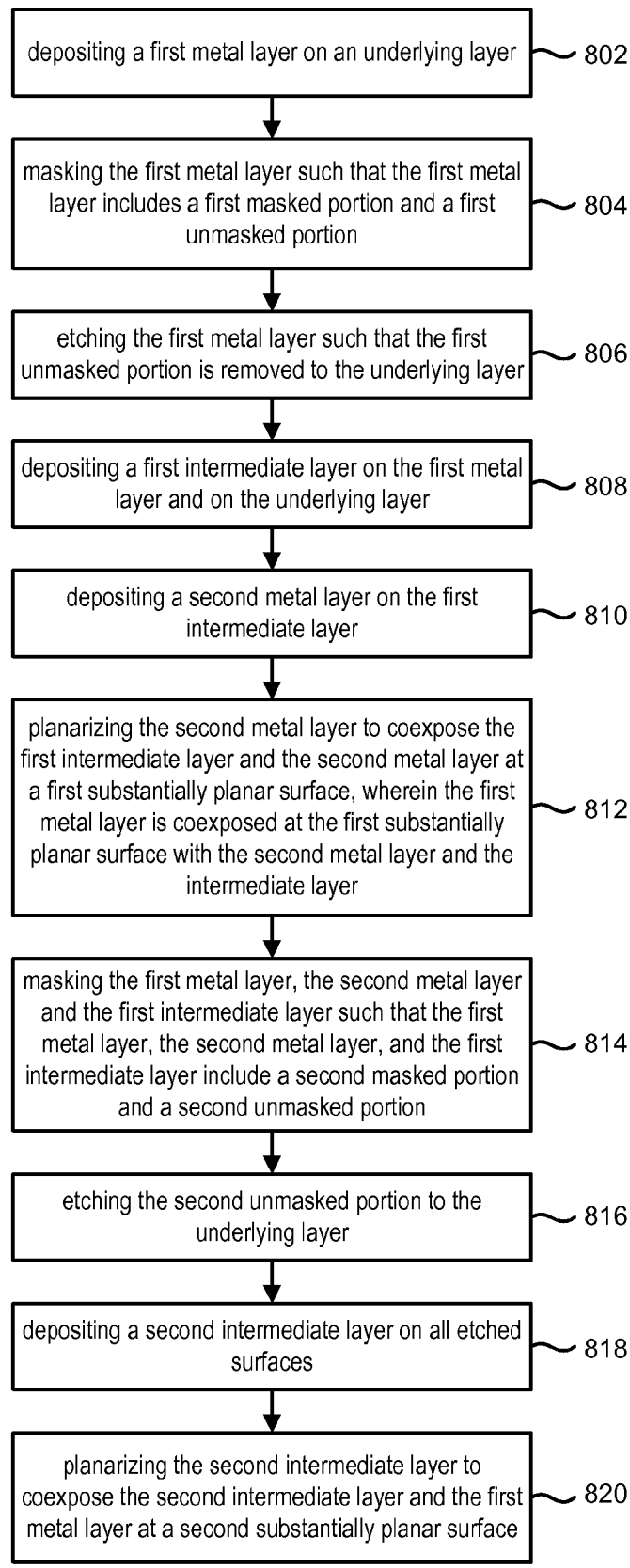
FIG. 12 is a flowchart describing a method for depositing at least two metal layers on an underlying layer.

FIG. 12 is a flowchart describing a method for depositing at least two metal layers on an underlying layer, comprising: depositing a first metal layer on the underlying layer (802); masking the first metal layer such that the first metal layer includes a first masked portion and a first unmasked portion (804); etching the first metal layer such that the first unmasked portion is removed to the underlying layer (806); depositing a first intermediate layer on the first metal layer and on the underlying layer (808); depositing a second metal layer on the first intermediate layer (810); planarizing the second metal layer to coexpose the first intermediate layer and the second metal layer at a first substantially planar surface, wherein the first metal layer is coexposed at the first substantially planar surface with the second metal layer and the intermediate layer (812); masking the first metal layer, the second metal layer, and the first intermediate layer such that the first metal layer, the second metal layer, and the first intermediate layer include a second masked portion and a second unmasked portion (814); etching the second unmasked portion to the underlying layer (816); depositing a second intermediate layer on all etched surfaces (818); and planarizing the second intermediate layer to coexpose the second intermediate layer and the first metal layer at a second substantially planar surface (820).

Figure 13:
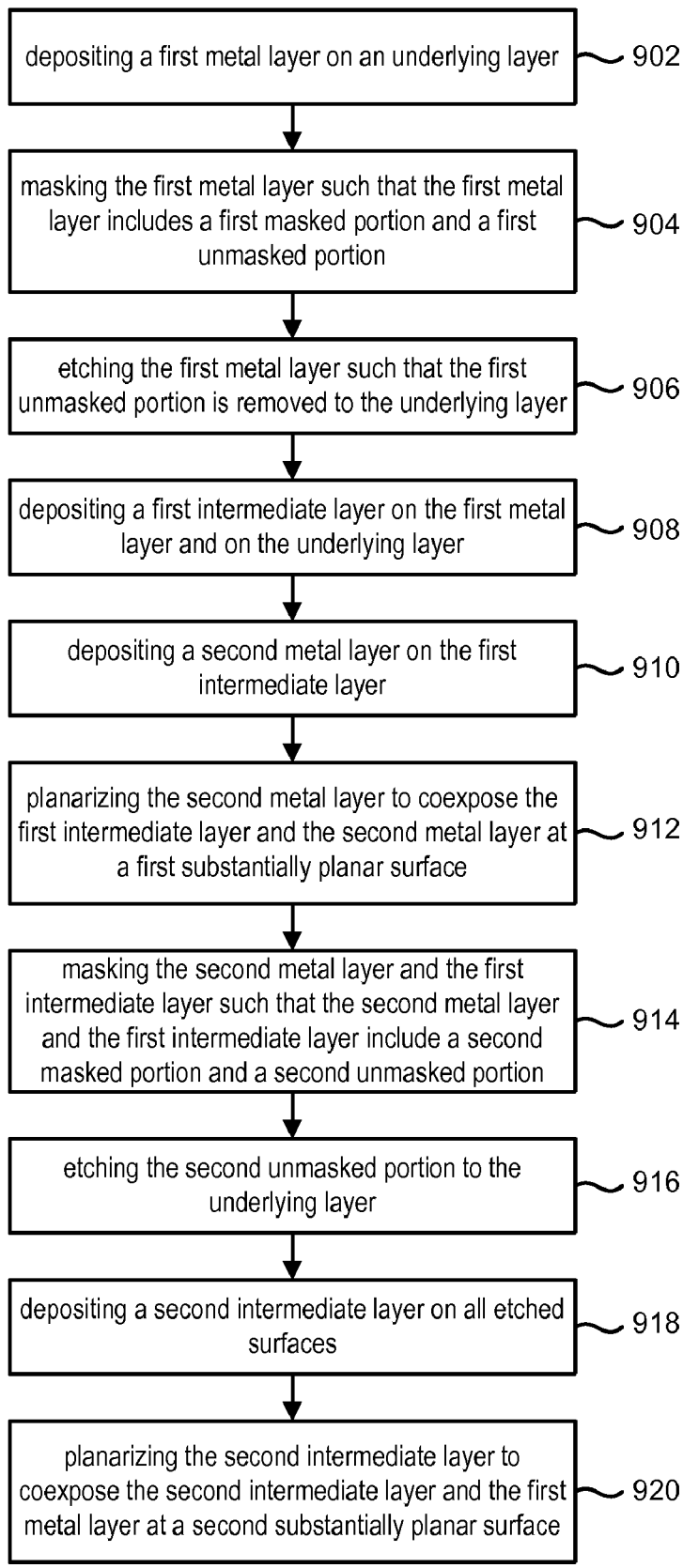
FIG. 13 is a flowchart describing a method for depositing at least two metal layers on an underlying layer.

FIG. 13 is a flowchart describing a method for depositing at least two metal layers on an underlying layer, comprising: depositing a first metal layer on the underlying layer (902); masking the first metal layer such that the first metal layer includes a first masked portion and a first unmasked portion (904); etching the first metal layer such that the first unmasked portion is removed to the underlying layer (906); depositing a first intermediate layer on the first metal layer and on the underlying layer (908); depositing a second metal layer on the first intermediate layer (910); planarizing the second metal layer to coexpose the first intermediate layer and the second metal layer at a first substantially planar surface (912); masking the second metal layer and the first intermediate layer such that the second metal layer and the first intermediate layer include a second masked portion and a second unmasked portion (914); etching the second unmasked portion to the underlying layer (916); depositing a second intermediate layer on all etched surfaces (918); and planarizing the second intermediate layer to coexpose the second intermediate layer and the first metal layer at a second substantially planar surface (920).

While this invention has been described in terms of several preferred embodiments, there are alterations, permutations, and equivalents, which fall within the scope of this invention. It should also be noted that there are many alternative ways of implementing the methods and apparatuses of the present invention. For example, although references to FIGS. 7 and 8 disclose independent coplanar and non-coplanar embodiments, it may be appreciated that those embodiments are not mutually exclusive and may, in some embodiments, be utilized in combination without departing from the present invention. Although various examples are provided herein, it is intended that these examples be illustrative and not limiting with respect to the invention. Further, the abstract is provided herein for convenience and should not be employed to construe or limit the overall invention, which is expressed in the claims. It is therefore intended that the following appended claims be interpreted as including all such alterations, permutations, and equivalents as fall within the true spirit and scope of the present invention.

The foregoing detailed description has described only a few of the many forms that this invention can take. For this reason, this detailed description is intended by way of illustration, and not by way of limitation. It is only the following claims, including all equivalents, which are intended to define the scope of this invention.

What is claimed is:

1. A method for depositing at least two metal layers on an underlying layer comprising:
    depositing a first metal layer on the underlying layer;
    masking the first metal layer such that the first metal layer includes a first masked portion and a first unmasked portion;
    etching the first metal layer such that the first unmasked portion is removed to the underlying layer;
    depositing a first intermediate layer on the first metal layer and on the underlying layer;
    depositing a second metal layer on the first intermediate layer;
    planarizing the second metal layer to coexpose the first intermediate layer and the second metal layer at a first substantially planar surface;
    masking the second metal layer and the first intermediate layer such that the second metal layer and the first intermediate layer include a second masked portion and a second unmasked portion;
    etching the second unmasked portion to the underlying layer;
    depositing a second intermediate layer on all etched surfaces; and
    planarizing the second intermediate layer to coexpose the second intermediate layer and the first metal layer at a second substantially planar surface.

2. The method of claim 1 further comprising:
    electrically connecting a portion of the first metal layer with a portion of the second metal layer.

3. The method of claim 1 wherein the first intermediate layer comprises $Si_3N_4$ or $SiO_2$ or the second intermediate layer comprises $Si_3N_4$ or $SiO_2$.

4. The method of claim 1 wherein planarizing the second metal layer is performed by chemical mechanical polishing or etchback.

5. The method of claim 1 wherein the first metal layer and the second metal layer are substantially the same composition.

6. The method of claim 1 wherein, after the etching step, the first metal layer is in the form of a plurality of substantially parallel first metal lines.

7. The method of claim 1, wherein planarizing the second metal layer does not expose the first metal layer.

8. The method of claim 6 wherein, after the planarizing step, the second metal layer is in the form of a plurality of substantially parallel second metal lines, the second metal lines interspersed with first metal lines.

9. A method for depositing at least two metal layers on an underlying layer comprising:
    depositing a first metal layer on the underlying layer;
    masking the first metal layer such that the first metal layer includes a first masked portion and a first unmasked portion;
    etching the first metal layer such that the first unmasked portion is removed to the underlying layer;
    depositing a first intermediate layer on the first metal layer and on the underlying layer;
    depositing a second metal layer on the first intermediate layer;

planarizing the second metal layer to coexpose the first intermediate layer and the second metal layer at a first substantially planar surface, wherein the first metal layer is coexposed at the first substantially planar surface with the second metal layer and the first intermediate layer;

masking the first metal layer, the second metal layer, and the first intermediate layer such that the first metal layer, the second metal layer, and the first intermediate layer include a second masked portion and a second unmasked portion;

etching the second unmasked portion to the underlying layer;

depositing a second intermediate layer on all etched surfaces; and planarizing the second intermediate layer to coexpose the second intermediate layer and the first metal layer at a second substantially planar surface.

10. The method of claim 9 wherein the first intermediate layer comprises $Si_3N_4$ or $SiO_2$ or the second intermediate layer comprises $Si_3N_4$ or $SiO_2$.

11. The method of claim 9 wherein planarizing the second intermediate layer is performed by chemical mechanical polishing or etchback.

12. A method for forming first metal features and second metal features on an underlying layer for use with a semiconductor device, the method comprising:

depositing a first metal layer on the underlying layer;

masking the first metal layer such that the first metal layer includes a first masked portion and a first unmasked portion, wherein the first masked portion and the first unmasked portion correspond to a complementary pattern;

etching the first metal layer such that the first unmasked portion is removed to the underlying layer, leaving the first metal features;

depositing a first conformal dielectric layer on the first metal layer and on the underlying layer;

depositing a second metal layer on the first conformal dielectric layer;

planarizing the second metal layer to form the second metal features and to coexpose the second metal features and the first conformal dielectric layer at a first substantially planar surface;

masking the second metal features and the first conformal dielectric layer such that the second metal features and the first conformal dielectric layer include a second masked portion and a second unmasked portion;

etching the second unmasked portion to the underlying layer;

depositing a second conformal dielectric layer on all etched surfaces; and planarizing the second conformal dielectric layer to coexpose the first conformal dielectric layer and the second metal features at a second substantially planar surface.

13. The method of claim 12 further comprising electrically connecting a portion of the first metal features with a portion of the second metal features.

14. The method of claim 12 wherein the first conformal dielectric layer comprises $Si_3N_4$ or $SiO_2$ or the second conformal dielectric layer comprises $Si_3N_4$ or $SiO_2$.

15. The method of claim 12 wherein planarizing the second metal layer is performed by chemical mechanical polishing or etchback.

16. The method of claim 12 wherein the first metal layer is a composition selected from the group consisting of tungsten and aluminum.

17. The method of claim 12 wherein the second metal layer is a composition selected from the group consisting of tungsten, aluminum, and copper.

18. The method of claim 12, wherein planarizing the second metal layer does not expose the first metal features.

19. The method of claim 17 wherein when the second metal layer is tungsten, the method further comprises:

after the depositing the first conformal dielectric layer, depositing a first conformal adhesion layer on the first conformal dielectric layer.

20. The method of claim 19 wherein the first conformal adhesion layer is selected from the group consisting of: Ti, TiW, and TiN.

21. A method for forming first metal features and second metal features on an underlying layer for use with a semiconductor device, the method comprising:

depositing a first metal layer on the underlying layer;

masking the first metal layer such that the first metal layer includes a first masked portion and a first unmasked portion, wherein the first masked portion and the first unmasked portion correspond to a complementary pattern;

etching the first metal layer such that the first unmasked portion is removed to the underlying layer, leaving the first metal features;

depositing a first conformal dielectric layer on the first metal layer and on the underlying layer;

depositing a second metal layer on the first conformal dielectric layer;

planarizing the second metal layer to form the second metal features and to coexpose the first metal features, the second metal features, and the first conformal dielectric layer at a substantially planar surface;

masking the first metal features, the second metal features, and the first conformal dielectric layer such that the first metal features, the second metal features, and the first conformal dielectric layer include a second masked portion and a second unmasked portion;

etching the second unmasked portion to the underlying layer;

depositing a second conformal dielectric layer on all etched surfaces; and planarizing the second conformal dielectric layer to expose the first metal features.

22. The method of claim 21 wherein the first conformal dielectric layer comprises $Si_3N_4$ or $SiO_2$ or the second conformal dielectric layer comprises $Si_3N_4$ or $SiO_2$.

23. The method of claim 21 wherein planarizing the second conformal dielectric layer is performed by chemical mechanical polishing or etchback.

* * * * *

UNITED STATES PATENT AND TRADEMARK OFFICE
CERTIFICATE OF CORRECTION

PATENT NO. : 7,927,990 B2  
APPLICATION NO. : 11/771137  
DATED : April 19, 2011  
INVENTOR(S) : Hsia et al.

Page 1 of 1

It is certified that error appears in the above-identified patent and that said Letters Patent is hereby corrected as shown below:

Title Page, Item 73, Assignee: Delete "SanDisk Corporation, Milpitas, CA (US)" and replace with -- SanDisk 3D LLC, Milpitas, CA (US) --

Signed and Sealed this  
First Day of May, 2012

David J. Kappos  
*Director of the United States Patent and Trademark Office*